(12) United States Patent
Udono et al.

(10) Patent No.: US 11,011,664 B2
(45) Date of Patent: May 18, 2021

(54) PHOTODIODE AND PHOTOSENSITIVE DEVICE

(71) Applicants: IBARAKI UNIVERSITY, Mito (JP); JX NIPPON MINING & METALS CORPORATION, Tokyo (JP)

(72) Inventors: Haruhiko Udono, Hitachi (JP); Toshiaki Asahi, Tokyo (JP)

(73) Assignees: IBARAKI UNIVERSITY, Mito (JP); JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 16/604,682

(22) PCT Filed: Sep. 20, 2018

(86) PCT No.: PCT/JP2018/034898
§ 371 (c)(1),
(2) Date: Oct. 11, 2019

(87) PCT Pub. No.: WO2019/187222
PCT Pub. Date: Oct. 3, 2019

(65) Prior Publication Data
US 2020/0052142 A1 Feb. 13, 2020

(30) Foreign Application Priority Data
Mar. 30, 2018 (JP) .............................. JP2018-067691

(51) Int. Cl.
*H01L 31/103* (2006.01)
*H01L 31/0224* (2006.01)
*H01L 31/032* (2006.01)

(52) U.S. Cl.
CPC .... *H01L 31/103* (2013.01); *H01L 31/022416* (2013.01); *H01L 31/032* (2013.01)

(58) Field of Classification Search
CPC ........... H01L 31/103; H01L 31/022416; H01L 25/167; H01L 31/107; H01L 27/14643
See application file for complete search history.

(56) References Cited

U.S. PATENT DOCUMENTS 4,782,377 A * 11/1988 Mahan ................. G02B 6/4246
250/370.01
4,914,042 A * 4/1990 Mahan ................. G02B 6/4246
148/DIG. 139

(Continued)

FOREIGN PATENT DOCUMENTS

JP 2001-102641 A 4/2001
JP 2007-71547 A 3/2007

(Continued)

OTHER PUBLICATIONS

Daitoku, Kenta et al. "Fabrication and characterization of Mg2Si pn-junction Photodiode with a ring electrode." (2015). (Year: 2015).*

(Continued)

*Primary Examiner* — Jonathan Han
(74) *Attorney, Agent, or Firm* — Birch, Stewart, Kolasch & Birch, LLP.

(57) ABSTRACT

Provided is a semiconductor photodiode which has an electrode structure having not only high adhesion to a $Mg_2Si$ material but also improved overall performance including photosensitivity. A photodiode comprising: a pn junction of a magnesium silicide crystal; an electrode comprising a material that is in contact with p-type magnesium silicide; and an electrode comprising a material that is in contact with n-type magnesium silicide, wherein the material that is in contact with p-type magnesium silicide is a material which has a work function of 4.81 eV or more and reacts with silicon to form a silicide or form an alloy with magnesium.

7 Claims, 4 Drawing Sheets

(56) References Cited

U.S. PATENT DOCUMENTS

| | | | | |
|---|---|---|---|---|
| 4,940,898 A | * | 7/1990 | Mahan | G02B 6/4246 250/338.4 |
| 2016/0093538 A1 | | 3/2016 | Wakatsuki et al. | |
| 2017/0141267 A1 | | 5/2017 | Tange et al. | |

FOREIGN PATENT DOCUMENTS

| | | |
|---|---|---|
| JP | 2012-169521 A | 9/2012 |
| JP | 2015-26761 A | 2/2015 |
| JP | 2015-99822 A | 5/2015 |
| JP | 2016-72352 A | 5/2016 |
| WO | WO 2014/171146 A1 | 10/2014 |
| WO | WO 2016/006298 A1 | 1/2016 |
| WO | WO-2017136793 A1 * | 8/2017 ............. H01L 35/22 |

OTHER PUBLICATIONS

Udono, Haruhiko et al. "Infrared photoresponse from pn-junction Mg2Si diodes fabricated by thermal diffusion" Feb. 2013, Journal of Physics and Chemistry of Solids, vol. 74, Issue 2, pp. 311-314 (Year: 2013).*

Akiyama et al., "Fabricartion of $Mg_2Si$ pn-junction Photodiode with Shallow Mesa-structure and Ring Electrode," Proc. Asia-Pacific Conf. on Simiconducting Silicides and Related Materials 2016, JJAP Conf. Proc. 5, 011102. 2017, 5 Pages.

Sekino et al., "Preparation of Schottky contacts on n-type $Mg_2Si$ single crystalline substrate," Elsevier, Physics Procedia, vol. 11, 2011, pp. 171-173.

International Preliminary Report on Patentability (PCT/IPEA/409) dated Oct. 1, 2020 for corresponding Application No. PCT/ JP2018/034898 with an English translation.

Daitoku et al., "Fabrication and Characterization of $Mg_2Si$ pn-junction Photodiode with a Ring Electrode", JJAP Conf. Proc., vol. 3, 2015, pp. 011103-1-011103-4.

International Preliminary Report on Patentability (PCT/IPEA/409) dated Jul. 5, 2019 for Application No. PCT/ JP2018/034898 with an English translation.

International Search Report (PCT/ISA/210) dated Dec. 4, 2018 for Application No. PCT/JP2018/034898 with an English translation.

Udono et al., "Infrared photoresponse from pn-junction $Mg_2si$ diodes fabricated by thermal diffusion", Journal of Physics and Chemistry of Solids, vol. 74, 2013 (Available online Oct. 24, 2012), pp. 311-314.

Written Opinion of the International Searching Authority dated Dec. 4, 2018 for Application No. PCT/JP2018/034898.

* cited by examiner

[FIG. 1]
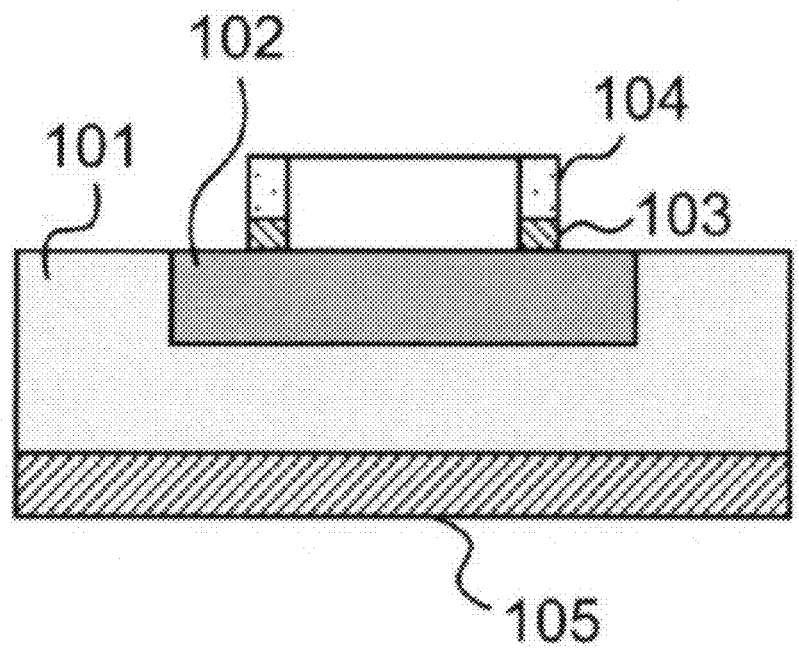

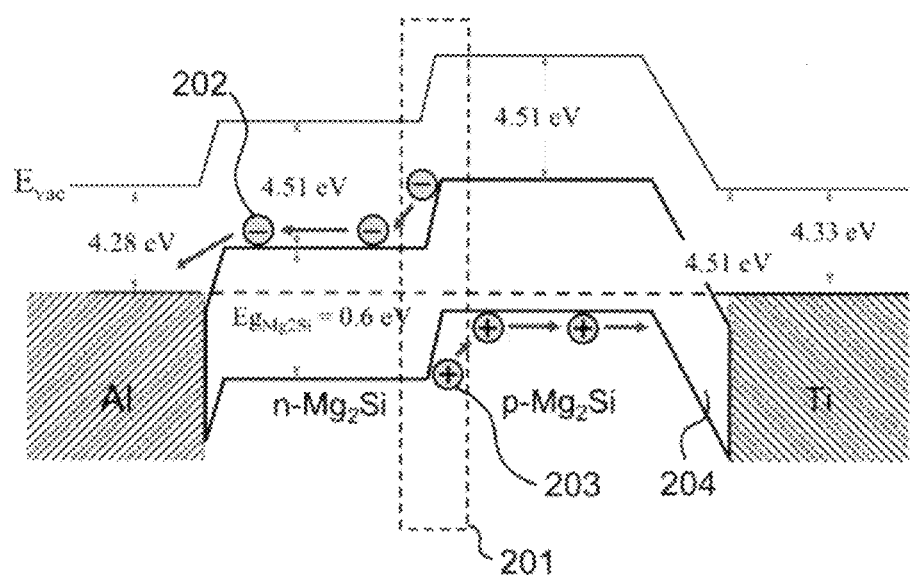
[FIG. 2]

[FIG. 3]
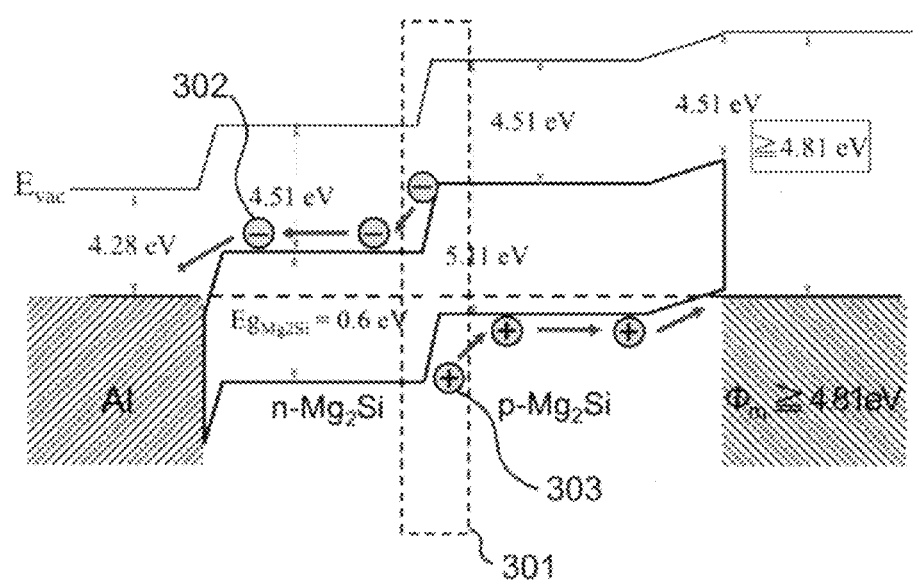

[FIG. 4]
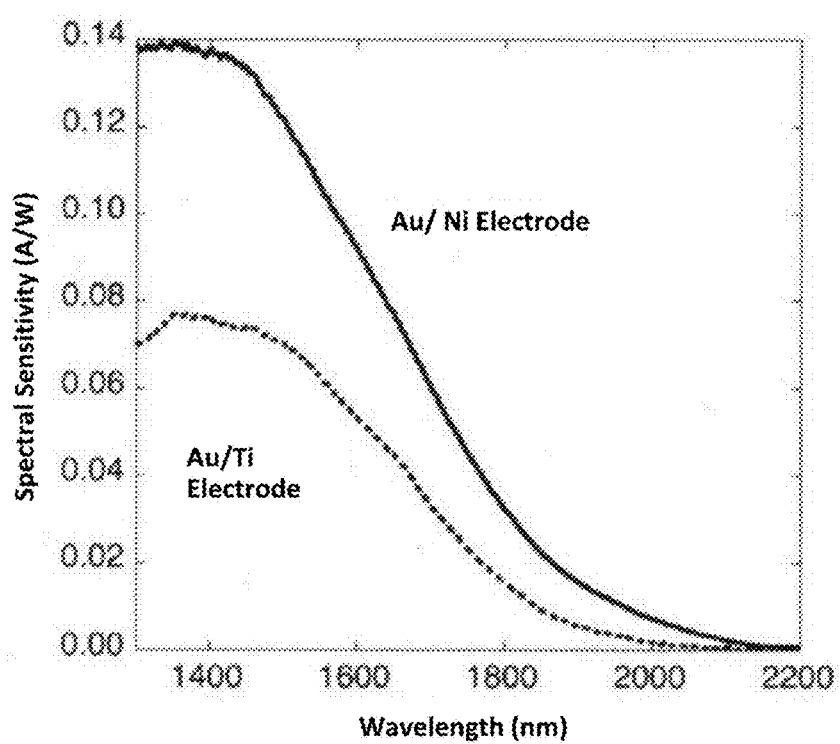

PHOTODIODE AND PHOTOSENSITIVE DEVICE

TECHNICAL FIELD

The present invention relates to a photodiode using magnesium silicide.

BACKGROUND ART

With recent dramatic technological innovation in relation to artificial intelligence (AI) and the like, research and development of a system for automatic monitoring and controlling in place of human eyes and hands are being energetically carried out. In such automatic monitoring and automatic controlling systems, an appropriate response operation is determined based on various input information such as lights, temperatures and voices, so a hardware for detecting input signals will be a key device that plays an important role in the entire system. Particularly, in terms of detecting the light input signals, advanced automatic monitoring can be realized by using a device that replaces the human eyes or in some cases can detect information in areas which cannot be detected by the human eyes.

Devices that are sensitive to optical input signals include those having elements that convert the optical signals into electrical signals capable of being processed electronically. Examples of the basic elements include light detection elements using semiconductor materials, and among them, photodiodes using a pn junction is known in the art.

The photodiodes using semiconductor materials have different sensitive wavelength regions depending on band gaps possessed by the semiconductor materials. In order to perform advanced control that can respond to automatic monitoring at night, automatic driving of a motor vehicle and the like, input information regarding a light in an infrared region is required in addition to a light in a visible light region and information of an image. Therefore, there is a strong need for elements and devices including photodiodes that can detect light inputs with high sensitivity in the infrared region, so that active studies and developments are being advanced using various semiconductor materials.

Photodiodes using compound semiconductor materials such as InGaAs, HgCdTe and InAsSb are already known as photodiodes that assume detection of the light in the infrared region having a short wavelength (a wavelength of about 0.9 to 2.5 µm). However, these semiconductor materials have disadvantages of containing rare elements in the compound materials, or being harmful to the living body and having high environmental loading. Therefore, the present inventors have prepared a crystalline material of magnesium silicide ($Mg_2Si$), a compound semiconductor composed of magnesium (Mg) and silicon (Si), which is a material which is rich in nature as a resource and which is less harmful to the living body and highly safety (Non-Patent document 1), and proposed and produced a photodiode using the material to provide certain results (Non-Patent Documents 2 and 3).

As an electrode used for a semiconductor device, a gold (Au) electrode is often used as described in Non-Patent Document 2, from the viewpoints of conductivity and chemical stability, and further easiness of formation. However, Au is chemically stable, so that it does not easily react particularly with Si or Si-based compounds, and tends to have poor adhesion at a contact interface with the semiconductor. Therefore, it tends to generate peeling and separating of the electrode from the contact interface with the semiconductor, causing a problem of durability and operability of the device, in view of a practical use environment of a practical device.

To solve such problems, an attempt to improve adhesion at the contact surface between the electrode material and the semiconductor material has been made in the Si-based semiconductor device by interposing other metal material between the Au electrode and the contact surface with the semiconductor. Non-Patent Document 3 discloses that titanium (Ti) is interposed between an Au electrode and a contact surface of $Mg_2Si$ that is the semiconductor material. It has allowed provision of an electrode having an adhesion that would not cause any problem in view of a practical device, even in the photodiode using $Mg_2Si$ as a semiconductor material.

However, further subsequent consideration of physical properties specific for $Mg_2Si$ has revealed that Ti is not necessarily best as an electrode material that is in direct contact with $Mg_2Si$ in order to improve further the overall device performance including photosensitivity in addition to the point of the adhesion between the electrode and the semiconductor material, and that it is necessary to study the electrode material from other viewpoints.

CITATION LIST

Non-Patent Literatures

Non-Patent Document 1: K. Sekino et al., Phys. Proc., Vol. 11, 2011, pp. 170-173

Non-Patent Document 2: T. Akiyama et al., Proc. Asia-Pacific Conf. Semicond. Silicides Relat. Mater. 2016, JJAP Conf. Proc. Vol. 5, 2017, pp. 011102-1-011102-5

Non-Patent Document 3: K. Daitoku et al., Proc. Int. Conf. Summer School Adv. Silicide Technol. 2014, JJAP Conf. Proc. Vol. 3, 2015, pp. 011103-1-011103-4

SUMMARY OF INVENTION

Technical Problem

The technique of the present disclosure is intended to solve the above technical problems. An object of the present disclosure is to provide a semiconductor photodiode using $Mg_2Si$ as a semiconductor material, which has an electrode structure having not only high adhesion to the $Mg_2Si$ material but also improved overall performance including photosensitivity.

Solution to Problem

As basic findings based on the technique of the present disclosure, the present inventors have focused on inherent physical property values regarding an energy level of $Mg_2Si$ in the process of clarifying the basic physical properties of the compound semiconductor of $Mg_2Si$. Detailed physical properties of the compound of $Mg_2Si$ have been little known, but as a result of further studies based on the contents disclosed in Non-Patent Document 1, the present inventors have recognized the fact that an electron affinity (an energy level difference between a vacuum level and a conduction band) in $Mg_2Si$ is 4.51 eV. Then, in view of the inherent physical property values of $Mg_2Si$, the present inventors have conceived a technical means that can further improve characteristics of the $Mg_2Si$ photodiode by appropriately selecting the electrode material.

More particularly, as described below, the present disclosure relates to a technique that prevents an energy barrier in a transport direction of photo carriers from being generated at a semiconductor/electrode interface by appropriately adjusting a relationship between the energy levels of $Mg_2Si$ and the electrode material. FIG. 1 shows an example of the basic structure of the $Mg_2Si$ photodiode, and FIG. 2 shows an energy level diagram for a pn junction and an electrode near-field region in a case where an electrode material 103 directly contacted with a p-type $Mg_2Si$ part 102 is Ti (which is a material also used in Non-Patent Document 3) and an electrode material 105 directly contacted with a n-type $Mg_2Si$ portion 101 is Al in the structure of FIG. 1. Among electron-hole pairs which are photo carriers generated in a depletion layer (and a diffusion length) 201 of the pn junction by light incidence, an electron 202 moves to a position of a lower energy level and the hole 203 moves to a position of a higher energy level.

The problem here is a difference in work functions between the p-type $Mg_2Si$ and the electrode. The work function of the semiconductor is a value obtained by adding to an electron affinity an energy difference $\Delta E_F$ from a conduction band to a Fermi level. The Fermi level varies with the carrier concentration in the semiconductor, and has a value of $\Delta E_F$ between 0 and 0.3 eV in n-type, and a value of $\Delta E_F$ between 0.3 and 0.6 eV in p-type for $Mg_2Si$. From the electron affinity for $Mg_2Si$ as shown above, the work function of p-type $Mg_2Si$ is between 4.81 and 5.11 eV. The work function of Ti which is the material of the electrode conventionally used herein is about 4.33 eV, which is lower than the lowest work function value of 4.81 eV for $Mg_2Si$ as shown above. Therefore, an energy barrier 204 for electron holes is generated at the interface between the p-type $Mg_2Si$ and the electrode, which cases a problem that the proportion of electron holes which can reach the electrode is decreased among the generated electron holes, and the generated photo carriers may not be effectively detected as photocurrent.

In contrast, as shown in FIG. 3, when the electrode material that is in contact with p-type $Mg_2Si$ is made of a material having a work function of 4.81 eV or more, the energy barrier for electron holes is eliminated at the interface between p-type $Mg_2Si$ and the electrode, or an impact of the energy barrier can be reduced to a level that would cause no practical problem, and many of the electron holes of the electron-hole pairs generated as photo carriers can reach the electrode, thereby effectively contributing to a value of photocurrent.

Based on the findings and ideas as above, the present disclosure provides the following inventions:

1)
A photodiode comprising: a pn junction of a magnesium silicide crystal; an electrode comprising a material that is in contact with p-type magnesium silicide; and an electrode comprising a material that is in contact with n-type magnesium silicide,
wherein the material that is in contact with p-type magnesium silicide is a material which has a work function of 4.81 eV or more and reacts with silicon to form a silicide or form an alloy with magnesium.

2)
The photodiode according to 1), wherein the material that is in contact with p-type magnesium silicide is at least one metal selected from the group consisting of nickel, cobalt, platinum, palladium, iridium, rhenium, rhodium, beryllium, selenium, and tellurium, or at least one alloy thereof.

3)
The photodiode according to 1) or 2), wherein the material that is in contact with n-type magnesium silicide is a material which has a work function of less than 4.81 eV and reacts with silicon to form a silicide or form an alloy with magnesium.

4)
The photodiode according to any one of 1) to 3), wherein the material that is in contact with n-type magnesium silicide is at least one metal selected from the group consisting of aluminum, gallium, indium, arsenic, antimony, bismuth, silver, copper, zinc, cadmium, titanium, vanadium, chromium, manganese, iron, yttrium, zirconium, niobium, molybdenum, hafnium, tantalum and tungsten, or at least one alloy thereof.

5)
The photodiode according to any one of 1) to 4), wherein the electrode comprising the material that is in contact with p-type magnesium silicide comprises: the material that is in contact with p-type magnesium silicide; and other material that is in contact with the former material.

6)
The photodiode according to 5), wherein the other material is at least one metal selected from the group consisting of gold, palladium and platinum or at least one alloy thereof, except for the metal selected as the material that is in contact with p-type magnesium silicide.

7)
The photodiode according to any one of 1) to 6), wherein the material that is in contact with p-type magnesium silicide is in a form of a thin film having a thickness of from 1 to 1000 nm.

8)
The photodiode according to any one of 1) to 7), wherein the p-type magnesium silicide is magnesium silicide doped with silver.

9)
The photodiode according to any one of 1) to 8), wherein at least one of the electrodes is a ring-shaped electrode having an opening on its inner side.

10)
A photosensitive device comprising the photodiode according to any one of 1) to 9).

Advantageous Effects of Invention

According to the technique of the present disclosure, it is possible to provide a photodiode using a pn junction of $Mg_2Si$ which is a compound semiconductor, which has improved overall performance including photosensitivity, because the semiconductor photodiode can improve the adhesion between $Mg_2Si$ and the electrode material, as well as significantly increase photo carriers that can reach the electrode from $Mg_2Si$, in particular electron holes that can reach the electrode from p-type $Mg_2Si$.

BRIEF DESCRIPTION OF DRAWINGS

FIG. 1 shows a basic structure of an $Mg_2Si$ photodiode.
FIG. 2 shows an energy level diagram for a conventional Ti electrode.
FIG. 3 shows an energy level diagram in the technique of the present disclosure.
FIG. 4 shows spectral sensitivity spectra of Example 1 and Comparative Example 1.

DESCRIPTION OF THE PREFERRED EMBODIMENTS

A photodiode according to the technique of the present disclosure basically includes: a pn junction of $Mg_2Si$ crystal;

an electrode containing a material that is in contact with p-type $Mg_2Si$; and an electrode containing a material that is in contact with n-type $Mg_2Si$. Preferably, the $Mg_2Si$ is composed of a crystalline material and is single crystal. Non-doped $Mg_2Si$ generally exhibits n-type conductivity, and the $Mg_2Si$ having the pn junction of $Mg_2Si$ formed such as by introducing a p-type impurity into a part of the $Mg_2Si$ is regarded as a main structure for the diode, and the main structure is provided with electrodes for extracting photocurrent to make the photodiode of the present disclosure.

The photodiode according to the present disclosure is characterized in that a material of the electrode that is in direct contact with p-type $Mg_2Si$ has a work function of 4.81 eV or more, and reacts with Si to form a silicide or form an alloy with magnesium. As described above, the electron affinity for $Mg_2Si$ is 4.51 eV, and its work function varies depending on the carrier concentration and is between 4.51 and 4.81 eV for n-type $Mg_2Si$ and between 4.81 and 5.11 eV for p-type $Mg_2Si$. Therefore, if the material of the electrode that is in contact with p-type $Mg_2Si$ has a work function of 4.81 eV or more, an energy barrier can be eliminated at an interface between the p-type $Mg_2Si$ and the electrode for electron holes to be transported to the electrode, among electron hole pairs of photo carriers formed in a depletion layer and a diffusion region of the pn junction, or an impact of the energy barrier can be reduced to such an extent that causes no practical problems, so that a collection efficiency of carriers can be significantly improved.

The material of the electrode that is in direct contact with p-type $Mg_2Si$ has a work function of 4.81 eV or more as described above, and reacts with Si to form a silicide or forms an alloy with magnesium. Thus, when the material of the electrode that is in direct contact with $Mg_2Si$ is the material that reacts with Si to form a silicide or an alloy with magnesium, a part of Si in $Mg_2Si$ can be allowed to react with the electrode material at the interface where $Mg_2Si$ is in contact with a part of the electrode material to form a strong bond, resulting in higher adhesion of p-type $Mg_2Si$ to the electrode enough to withstand the use as a practical device.

In the photodiode according to the present disclosure, examples of the electrode material that is in direct contact with p-type $Mg_2Si$, which has a work function of 4.81 eV or more and reacts with Si to form a silicide or form an alloy with magnesium, includes, at least one metal selected from the group consisting of nickel (Ni), cobalt (Co), platinum (Pt), palladium (Pd), iridium (Ir), rhenium (Re), rhodium (Rh), beryllium (Be), selenium (Se), and tellurium (Te), or at least one alloy thereof. The use of such a metal material as the electrode material that is in direct contact with p-type $Mg_2Si$ can lead to improved adhesion at the interface between the metals in the case of an electrode structure where the metal material is further provided with other metal material.

As described above, the energy barrier formed at the interface between p-type $Mg_2Si$ and the electrode that is in direct contact with p-type $Mg_2Si$ is problematic in the prior arts, but the same problem is caused at the interface between n-type $Mg_2Si$ and the electrode that is in direct contact with the n-type $Mg_2Si$. Since majority carriers will be electrons at the interface between n-type $Mg_2Si$ and the electrode, the work function of the electrode material that is in direct contact with n-type $Mg_2Si$ should be 4.81 eV or less which is the work function of n-type $Mg_2Si$, in order to prevent formation of the energy barrier for electrons transported to the electrode at the interface. Moreover, the electrode material is formed as a material that reacts with silicon to form a silicide or form an alloy with magnesium, whereby good adhesion to $Mg_2Si$ can be obtained.

As described above, examples of the material that has a work function of 4.81 eV or less and reacts with Si to form a silicide or form an alloy with magnesium include at least one metal selected from the group consisting of aluminum (Al), silver (Ag), titanium (Ti), gallium, indium, arsenic, antimony, bismuth, copper, zinc, cadmium, vanadium (V), chromium (Cr), manganese (Mn), iron (Fe), yttrium (Y), zirconium (Zr), niobium (Nb), molybdenum (Mo), hafnium (Hf), tantalum (Ta) and tungsten (W), or at least one alloy thereof. In the prior art Non-Patent Document 3, Ag having a work function of 4.26 eV is used as an electrode material that is in direct contact with n-type $Mg_2Si$.

In the photodiode according to the present disclosure, the electrode that is in contact with p-type $Mg_2Si$ may be an electrode having a structure including: a material that is in direct contact with p-type $Mg_2Si$; and other material that is in contact with the material. Such a structure can allow characteristics of the entire electrode to be changed to desired characteristics to further improve the characteristics, as compared with a case where the electrode material is made of only one material that is in direct contact with p-type $Mg_2Si$. For example, electrical properties, durability and weather resistance of the entire electrode can be improved by using an electrode formed by combining materials having higher conductivity than the material that is in direct contact with p-type $Mg_2Si$ or combining materials having high chemical stability.

Examples of such materials include at least one metal selected from the group consisting of Au, Pd, and Pt or at least one alloy thereof. A structure formed such that only Au or Pd or its alloy portion of the electrodes is exposed by means of an appropriate passivation treatment can allow prevention of the electrode material that is in direct contact with p-type $Mg_2Si$ from being degraded to achieve a photodiode having high durability and weather resistance, even if the electrode material is a material easily degraded by oxidation or the like.

Further, in the photodiode according to the present disclosure, a specific arrangement form and the like of the material that is in direct contact with p-type $Mg_2Si$ is not particularly limited, including, as a specific aspect, a thin film having a thickness of from 1 to 1000 nm. If the thickness is less than 1 nm, any sufficient adhesion to p-type $Mg_2Si$ may not be obtained. If the thickness is more than 1000 nm, the electrode may be easily separated, or the electrical resistance of the electrode may be increased, which may cause a decrease in photocurrent. The thickness can be 5 nm or more, or 8 nm or more, and 500 nm or less, or 100 nm or less.

As described above, the pn junction of $Mg_2Si$ crystal, which is the main structure of the photodiode according to the present disclosure, can be formed by doping a part of non-doped $Mg_2Si$ crystal that will generally be of n-type, with an impurity that will be of p-type, as described above. Such a dopant impurity includes Ag. Ag is an element which diffuses into the interior of the $Mg_2Si$ crystal by a heat treatment to form relatively easily a $Mg_2Si$ structure locally doped with Ag.

Furthermore, in the photodiode according to the present disclosure, a specific structure, shape and the like of the electrode are not particularly limited, and examples of the structure and the like include, in a specific embodiment, a ring-shaped electrode having an opening on its inner side, as an electrode on at least one side. As described above, when the ring-shaped electrode having an opening in its inner side is formed on a surface on at least one side of the structure where the pn junction is formed at a predetermined position in a depth direction from the surface of $Mg_2Si$, a light passing through the opening can excite photo carriers in a wide range of pn junctions, so that a photodiode having high photosensitivity can be realized.

In addition, the structure of FIG. 1 shows that the electrode on the side that is in contact with p-type $Mg_2Si$ is in the ring shape, but the present disclosure is not limited to this structure, and the electrode on a side that is in contact with n-type $Mg_2Si$ may be in the ring shape or the electrodes on both sides may be in the ring shape. Further, as used herein, the "ring shape" is not limited to a circular shape, and means an annular shape including oval and polygonal shapes.

Various photosensitive devices such as a photodetectors and imaging devices can be formed by using the $Mg_2Si$ photodiode having the structure as described above as a basic element structure. In particular, the $Mg_2Si$ photodiode according to the present disclosure has good sensitivity characteristics for infrared light in a wavelength range of from 900 to 1900 nm, among the short wavelength infrared ranges, and can be suitably used for a photosensitive device assuming the use in such a wavelength range.

A method for producing the photodiode according to the present disclosure is not particularly limited, and the photodiode according to the present invention may be produced by a method including any means as long as the above structure of the photodiode can be realized. Hereinafter, an example of the production method and technical means relating to the production which can be used to embody the structure of the photodiode according to the present disclosure are shown, although not limited thereto.

First, to form the pn junction of $Mg_2Si$ crystal, which will be a main structure of the photodiode according to the present disclosure, a crystalline material of $Mg_2Si$ is prepared. The single crystal material of $Mg_2Si$ is preferable as the crystalline material of $Mg_2Si$ as described above, and the single crystal material of $Mg_2Si$ can be obtained by a known method as disclosed in, for example, Non-Patent Document 1. In order to form the photodiode according to the present disclosure, it is preferable that the $Mg_2Si$ crystalline material is formed into a plate-shaped substrate having a thickness of from about 0.1 to 5 mm in advance, and is then used after polishing its surface, in terms of the process.

A part of the $Mg_2Si$ crystalline material prepared according to the above process is doped with a p-type impurity to form a pn junction of $Mg_2Si$. Since non-doped $Mg_2Si$ exhibits n-type conductivity, the doping of the part of non-doped $Mg_2Si$ with the p-type impurity to change a partial region of the crystalline material of $Mg_2Si$ to p-type $Mg_2Si$ will result in formation of pn junction at an interface between the doped region and the non-doped region.

The means for doping a part of the crystalline material of $Mg_2Si$ with the p-type impurity and the p-type impurity species (dopant) are not particularly limited, and desired means and dopants may be used. Herein, the use of Ag as a dopant and a doping method by thermal diffusion are given as an example. Ag is disposed as a diffusion source on the surface of the crystalline material of $Mg_2Si$, and heated in an inert atmosphere to diffuse thermally Ag from the surface of the crystalline material of $Mg_2Si$ to the interior. Ag as a diffusion source can be arranged and formed on the surface of the crystalline material of $Mg_2Si$ by vacuum deposition, sputtering or the like, in an amount required for thermal diffusion to the interior. The conditions of the heat treatment as described above can be adjusted and set in view of a diffusion rate and a depth of a diffusion region to be formed, i.e., a position where the pn junction is formed. For example, the heat treatment temperature may be set to 400 to 550° C., and the heat treatment time may be set within a range of from 30 seconds to 30 minutes.

An Electrode required for extracting and detecting photocurrent is then formed in each of the p-type and n-type regions of the $Mg_2Si$ crystal in which the pn junction is formed. A specific means for forming the electrode on the surface of the $Mg_2Si$ crystal in each of the p-type and n-type regions is not particularly limited, and the electrode may be formed by using known methods such as vacuum evaporation, sputtering and plating depending on the electrode material and the like. In this case, a masking or photolithographic technique may also be used to form a ring-shaped electrode or a desired electrode pattern, as disclosed in Non-Patent Documents 2 and 3.

In addition to the foregoing, further operation may be additionally carried out as needed which forms a multilayer electrode by carrying out electrode formation with other material, or forms a protective layer, or performing etching or polishing to remove a part of an unnecessary structure. The means and conditions specifically mentioned above are merely by way of example, and other means and conditions may be applied as long as the essential structure of the $Mg_2Si$ photodiode according to the present disclosure can be obtained.

EXAMPLES

The technical contents of the present disclosure will be specifically described below based on Example and Comparative Example. The following Example and Comparative Example are merely specific examples for better understanding of the technical contents of the present disclosure, and the scope of the present invention is not limited by these specific examples.

Example 1

A single crystal material of n-type $Mg_2Si$ grown by a vertical Bridgman method according to the method disclosed in Non-Patent Document 1 was prepared as a crystalline material of $Mg_2Si$, and the single crystal material was cut out at a (110) plane to mirror-polish both sides. After polishing, the material was washed to obtain a $Mg_2Si$ single crystal substrate having a thickness of 1 mm. The carrier concentration of the substrate is $6 \times 10^{15}$ $cm^{-3}$. An Ag layer having a diameter of 800 µm serving as a diffusion source was formed on a part of one surface of the substrate by a vacuum deposition method, and then thermally diffused from one surface of the $Mg_2Si$ substrate in the depth direction by carrying out a heat treatment in an argon (Ar) atmosphere at 450° C. for 10 minutes to form a p-type $Mg_2Si$ layer in a partial region of the n-type $Mg_2Si$ crystal.

Then, on the surface of the formed p-type $Mg_2Si$ layer, a circular ring-shaped Ni layer having an inner diameter of 500 µm, a width of 75 µm, and a thickness of 10 nm was formed by sputtering. An Au layer having a thickness of 300 nm and the same size as that of the Ni layer was then formed directly on the formed Ni layer by vacuum evaporation. In this example, in the pn junction of $Mg_2Si$ crystal, the material that is in direct contact with p-type $Mg_2Si$ is Ni having a work function of 5.15 eV, and the structure including the Ni layer and the Au layer formed directly thereon is an electrode on the p-type $Mg_2Si$ side. Further, an Al layer having a work function of 4.28 eV was formed so as to have a thickness of 300 nm by vacuum deposition over the entire surface of the n-type $Mg_2Si$ on the opposite side of the substrate, which was regarded as an electrode on the n-type $Mg_2Si$ side. It should be noted that the carrier concentration value in Example 1. In this example, the evaluation result of the adhesion of the electrode by the tape test method according to JIS H 8504 also indicated that the electrodes on both pn sides were 5% or less of the electrode area, and no problem of the adhesion of the electrode was observed.

These results are summarized in Table 1 below.

TABLE 1

| | Electrode in contact with p-type $Mg_2Si$ | | | Electrode in contact with n-type $Mg_2Si$ | | | Spectral Sensitivity Maximum Value |
|---|---|---|---|---|---|---|---|
| | Material | Work Function (eV) | Adhesion | Material | Work Function (eV) | Adhesion | |
| Example 1 | Ni | 5.15 | ○ | Al | 4.28 | ○ | 0.14 |
| Comparative Example 1 | Ti | 4.33 | ○ | Al | 4.28 | ○ | 0.08 | in the p-type region is $1\times10^{19}$ cm$^{-3}$ from the above diffusion conditions, and the work function of p-type $Mg_2Si$ at this time is estimated to be about 5.09 eV, and the work function of n-type $Mg_2Si$ is estimated to be about 4.62 eV, from the carrier concentrations in the p-type and n-type regions.

The spectral sensitivity characteristics of the $Mg_2Si$ photodiode thus produced were evaluated by measuring spectral sensitivity spectrum. The measurement was carried out by diffracting a light from a halogen lamp by a spectrometer and allowing the light to be incident from the opening side of the ring-shaped electrode to the photodiode formed as described above, and amplifying the resulting photocurrent by a circuit using an operational amplifier, and detecting the photocurrent using a lock-in amplifier.

FIG. 4 (the solid line) shows a spectral sensitivity spectrum at a wavelength of 1300 to 2200 nm. It was confirmed from the spectrum that the spectral sensitivity had a peak at a wavelength of 1350 nm, and its maximum value was about 0.14 NW. The adhesion of the electrodes was evaluated by a tape test method according to JIS H 8504, indicating that the electrodes adhering to the tape were 5% or less of the electrode area for both pn sides, and no problem of the adhesion of the electrodes was observed.

Comparative Example 1

A photodiode was produced by the same method as that of Example 1, with the exception that the material of the electrode layer that was in direct contact with the surface of the p-type $Mg_2Si$ layer was Ti. That is, in this Example, the material that is in direct contact with p-type $Mg_2Si$ is a layer of Ti having a work function of 4.33 eV, and the structure including the Ti layer and an Au layer formed directly on the Ti layer is an electrode on the p-type $Mg_2Si$ side in the pn junction of $Mg_2Si$ crystal. An electrode that is in contact with the entire surface of the opposing n-type $Mg_2Si$ is Al as in Example 1. In this example, the spectral sensitivity characteristics were also evaluated by the same means and conditions as those of Example 1. In addition, as with Example 1, the work function of p-type $Mg_2Si$ at this time is estimated to be about 5.09 eV, and the work function of n-type $Mg_2Si$ is estimated to be about 4.62 eV from the carrier concentrations in the p-type and n-type regions.

FIG. 4 (the dotted line) also shows a spectral sensitivity spectrum at wavelength of 1300 to 2200 nm. The shape of the spectrum is approximately similar to that of Example 1. However, it was confirmed that the maximum value of the spectral sensitivity at the peak position was less than about 0.08 NW, which was less than about 57% of the maximum As can be seen from the above results, no significant problem is recognized in both Examples in relation to the adhesion of the electrodes to $Mg_2Si$. This would be because both materials that are in direct contact with $Mg_2Si$ react with Si to form a silicide. However, for the values of the spectral sensitivities, a significant difference was observed between Example and Comparative Example. It is believed that, in Example 1 where the material that is in direct contact with p-type $Mg_2Si$ is Ni having a work function of 5.15 eV, no energy barrier for transportation of electron holes is formed at the interface between p-type $Mg_2Si$ and Ni electrode layer, so that the electron holes as majority carriers can effectively reach the electrodes.

On the other hand, it is believed that, in Comparative Example 1 where the material that is in direct contact with p-type $Mg_2Si$ is Ti having a work function of 4.33 eV, even if photo carriers are generated by light incidence, a part of the electron holes is prevented from transported to the electrode due to the energy barrier formed at the interface between the p-type $Mg_2Si$ and the Ti electrode layer, so that the photo carriers are not effectively detected as photoelectric current. In view of these, it has been found that it is highly effective to select and adjust appropriately the work function of the material that is in direct contact with p-type $Mg_2Si$ based on the technical idea according to the present disclosure, in order to improve the performance of the $Mg_2Si$ photodiode significantly.

INDUSTRIAL APPLICABILITY

According to the technique of the present disclosure, in the photodiode using the pn junction of $Mg_2Si$, the light sensitivity can be significantly improved as compared with the prior arts. Therefore, it is possible to improve dramatically the performance of various devices for sensing and imaging in the infrared regions at short wavelengths (approximately from 0.9 to 2.5 μm) assumed by photodiodes using $Mg_2Si$. Accordingly, a significant contribution can also be expected to techniques of various image analysis and image diagnosis in those wavelength ranges, and further automatic monitoring and automatic control techniques using them, as well as industrial fields using these techniques.

DESCRIPTION OF REFERENCE NUMERALS 104 other material electrode that is in contact with material that is in direct contact with p-type $Mg_2Si$
301 depletion layer and diffusion length
302 electron
303 electron holes

What is claimed is:

1. A photodiode comprising: a pn junction of a magnesium silicide crystal; an electrode comprising a material that is in contact with p-type magnesium silicide; and an electrode comprising a material that is in contact with n-type magnesium silicide,
   wherein the material that is in contact with p-type magnesium silicide is a material which has a work function of 4.81 eV or more and is capable of reacting with silicon to form a silicide or form an alloy with magnesium, and
   the material that is in contact with p-type magnesium silicide is at least one metal selected from the group consisting of nickel, cobalt, platinum, palladium, iridium, rhenium, rhodium, beryllium, selenium, and tellurium, or at least one alloy thereof,
   wherein the electrode comprising the material that is in contact with p-type magnesium silicide comprises: the material that is in contact with p-type magnesium silicide; and other material that is in contact with the former material, and
   the other material is at least one metal selected from the group consisting of gold, palladium and platinum or at least one alloy thereof, except for the metal selected as the material that is in contact with p-type magnesium silicide.

2. The photodiode according to claim 1, wherein the material that is in contact with n-type magnesium silicide is a material which has a work function of less than 4.81 eV and is capable of reacting with silicon to form a silicide or form an alloy with magnesium.

3. The photodiode according to claim 1, wherein the material that is in contact with n-type magnesium silicide is at least one metal selected from the group consisting of aluminum, gallium, indium, arsenic, antimony, bismuth, silver, copper, zinc, cadmium, titanium, vanadium, chromium, manganese, iron, yttrium, zirconium, niobium, molybdenum, hafnium, tantalum and tungsten, or at least one alloy thereof.

4. The photodiode according to claim 1, wherein the material that is in contact with p-type magnesium silicide is in a form of a thin film having a thickness of from 1 to 1000 nm.

5. The photodiode according to claim 1, wherein the p-type magnesium silicide is magnesium silicide doped with silver.

6. The photodiode according to claim 1, wherein at least one of the electrodes is a ring-shaped electrode having an opening on its inner side.

7. A photosensitive device comprising the photodiode according to claim 1.

* * * * *